United States Patent
Botker (10) Patent No.: US 9,000,747 B2
(45) Date of Patent: Apr. 7, 2015

(54) SINGLE SUPPLY AMPLIFIER WITH SWING TO GROUND

(71) Applicant: Linear Technology Corporation, Milpitas, CA (US)

(72) Inventor: Thomas Lloyd Botker, Andover, MA (US)

(73) Assignee: Linear Technology Corporation, Milpitas, CA (US)

( * ) Notice: Subject to any disclaimer, the term of this patent is extended or adjusted under 35 U.S.C. 154(b) by 260 days.

(21) Appl. No.: 13/829,652

(22) Filed: Mar. 14, 2013

(65) Prior Publication Data

US 2014/0266108 A1     Sep. 18, 2014

(51) Int. Cl.
*H02M 3/158* (2006.01)
*H03F 1/00* (2006.01)

(52) U.S. Cl.
CPC ........................................ *H03F 1/00* (2013.01)

(58) Field of Classification Search
USPC .......................... 330/252–261, 311; 323/282
See application file for complete search history.

(56) References Cited

U.S. PATENT DOCUMENTS

| | | | |
|---|---|---|---|
| 8,493,051 B2 * | 7/2013 | Ivanov et al. | 323/316 |
| 8,653,893 B2 * | 2/2014 | Tsuchi | 330/255 |

* cited by examiner

*Primary Examiner* — Hieu Nguyen
(74) *Attorney, Agent, or Firm* — Patent Law Group LLP; Brian D. Ogonowsky (57) ABSTRACT

An amplifier circuit has a voltage input terminal, for receiving Vin, and a voltage output terminal, for outputting Vout. A feedback circuit controls Vout to match Vin. A differential input stage receives Vin and Vout and generates a first output signal. An output stage comprises a pull down circuit for Vout. A main MOSFET is controlled by the first output signal to pull down Vout to match Vin when Vout is above a threshold voltage Vtrans. An auxiliary MOSFET, in parallel with the main MOSFET, is controlled by the first output signal to pull down Vout to match Vin when Vout is below Vtrans. The main MOSFET is turned substantially off when Vout is below Vtrans. A headroom generator coupled between the Vout terminal and a drain of the auxiliary MOSFET allows the auxiliary MOSFET to operate in its active region and pull Vout to ground.

28 Claims, 4 Drawing Sheets

SINGLE SUPPLY AMPLIFIER WITH SWING TO GROUND

FIELD OF THE INVENTION

This invention relates to amplifiers that receive an input voltage and generate an output voltage that is intended to accurately track the input voltage.

BACKGROUND

Amplifiers are frequently used to isolate an input source from a load and generate an output voltage that accurately tracks the input voltage. Amplifiers typically have an input stage and an output stage, where the output stage drives the load. The output stage typically provides a greater current than the input source.

In one example of an amplifier, it is assumed that the input voltage Vin can swing from ground to 5 volts (the Vcc rail voltage) and that the output stage uses a controllable pull-up current source in series with a controllable pull-down MOSFET to drive the load. In a simplified output stage, used to illustrate a problem with achieving a ground output voltage Vout, the source of the MOSFET is connected to ground, the drain is connected to the Vout terminal, and the controllable pull-up current source is connected to the Vout terminal and a 5 volt supply. Ideally, the MOSFET is an open circuit when Vout is intended to be 5 volts and a short circuit when Vout is intended to be at ground. One problem with such conventional output stages is that, when Vin is at ground, the voltage differential across the source-drain (i.e., Vds) of the output MOSFET cannot be at or near zero volts since the MOSFET then operates in its triode mode (operates like a resistor) and this limits the swing to ground. The triode mode is also known as the linear mode or ohmic mode where a slight change in the drain voltage linearly changes the current through the MOSFET (having a constant gate voltage). As the drain voltage (Vout) approaches zero while sinking current, the output voltage cannot swing to ground due to the on-resistance of the MOSFET times the load current. Therefore, the MOSFET cannot fully pull the Vout terminal to ground.

This problem can be overcome by connecting the source of the output MOSFET to a negative voltage (e.g., from a charge pump or external negative power supply) so that there is still a sufficiently high Vds for the MOSFET to pull the Vout terminal to ground (or even below ground), whether the MOSFET operates in its saturation region or its triode region. However, such dual power sources increase power consumption by the amplifier and, in the case of a negative power supply, add cost and board area.

What is needed is an amplifier that can pull its Vout terminal to ground (or below) using a single power supply for its output stage in a power efficient manner.

SUMMARY

An amplifier is disclosed that can swing Vout to ground (or lower) using a single power supply for its output stage.

A main MOSFET (connected in a cascode configuration) has its drain connected to the Vout terminal and operates to control the Vout terminal to swing between approximately Vcc and a designated low transition voltage Vtrans. Vtrans is typically set to a point where the main MOSFET begins to enter its triode mode, based on a worst case load assumption. When Vout reaches Vtrans, the gate voltage of the main MOSFET is controlled to be lowered to begin turning the main MOSFET off to prevent reverse conduction by the main MOSFET. Concurrently, an auxiliary MOSFET, which is coupled in parallel with the main MOSFET, begins to turn on. In one embodiment, the auxiliary MOSFET has a charge pump voltage source (e.g., 1.8 volts) connected between its drain and the Vout terminal to ensure the Vds of the auxiliary MOSFET is high enough for the auxiliary MOSFET to operate in its saturation mode (i.e., active region) even when Vout equals 0 volts (or a negative voltage). The charge pump is also referred to as a headroom generator. The auxiliary MOSFET may even operate in its triode mode and still pull Vout to ground. When Vout is at or near ground, the main MOSFET is substantially off and all current flows through the auxiliary MOSFET.

Also, when Vout reaches Vtrans, the charge pump voltage source turns on so that it does not waste power when it is not being used. Thus, the added circuitry of the present invention is very efficient since it draws substantially no power until needed. Further, power usage by the charge pump is minimal even when on, since the sinking load current is typically relatively low when Vout is below Vtrans. Voltage sources other than charge pumps may be used instead.

When Vout is somewhat above Vtrans (the auxiliary MOSFET is off), the amplifier may operate conventionally where all current flows through the main MOSFET, and the power consumption is basically the same as that of a conventional amplifier.

In a typical implementation, Vtrans will be set between about 50 mV to 400 mV.

In another embodiment, a voltage source is not connected between the drain of the auxiliary MOSFET and the Vout terminal, and the headroom is created by other headroom generator circuitry.

If there are voltage offsets between systems, it is possible for the amplifier's input voltage to go slightly negative. The present invention allows the output of the amplifier to also go negative while operating with a single power supply.

In the preferred embodiment, a third MOSFET is connected so that its drain is connected to the sources of the main MOSFET and the auxiliary MOSFET, its source is connected to ground, and its gate is connected to the output of the previous stage of the amplifier, such as an input stage. In such a configuration, the main MOSFET acts as a cascode transistor.

In the amplifier described above, Vout is generated by a controllable pull-up current source (e.g., a PMOS transistor), connected to the positive power supply terminal, in series with the controllable main MOSFET and auxiliary MOSFET. If the current source is not ideal, there will be some voltage drop across it in order for it to generate the desired current, resulting in the current source not being able to pull the Vout terminal up to the positive power supply voltage (Vcc). A mirror image of the main MOSFET, auxiliary MOSFET, and charge pump voltage source may be employed in the pull-up circuit to pull up Vout to Vcc, or even above Vcc. The conductivity types of the MOSFETs in the pull-up circuit (e.g., PMOS) would be opposite to those used to pull down Vout to ground (e.g., NMOS).

Bipolar transistors may be used instead of MOSFETs but may require additional circuitry to allow for saturation effects.

Other embodiments and novel features of the circuit are described.

BRIEF DESCRIPTION OF THE DRAWINGS

Elements that are the same or equivalent are labeled with the same numeral.

DETAILED DESCRIPTION

Figures 1, 2, 3, 4:
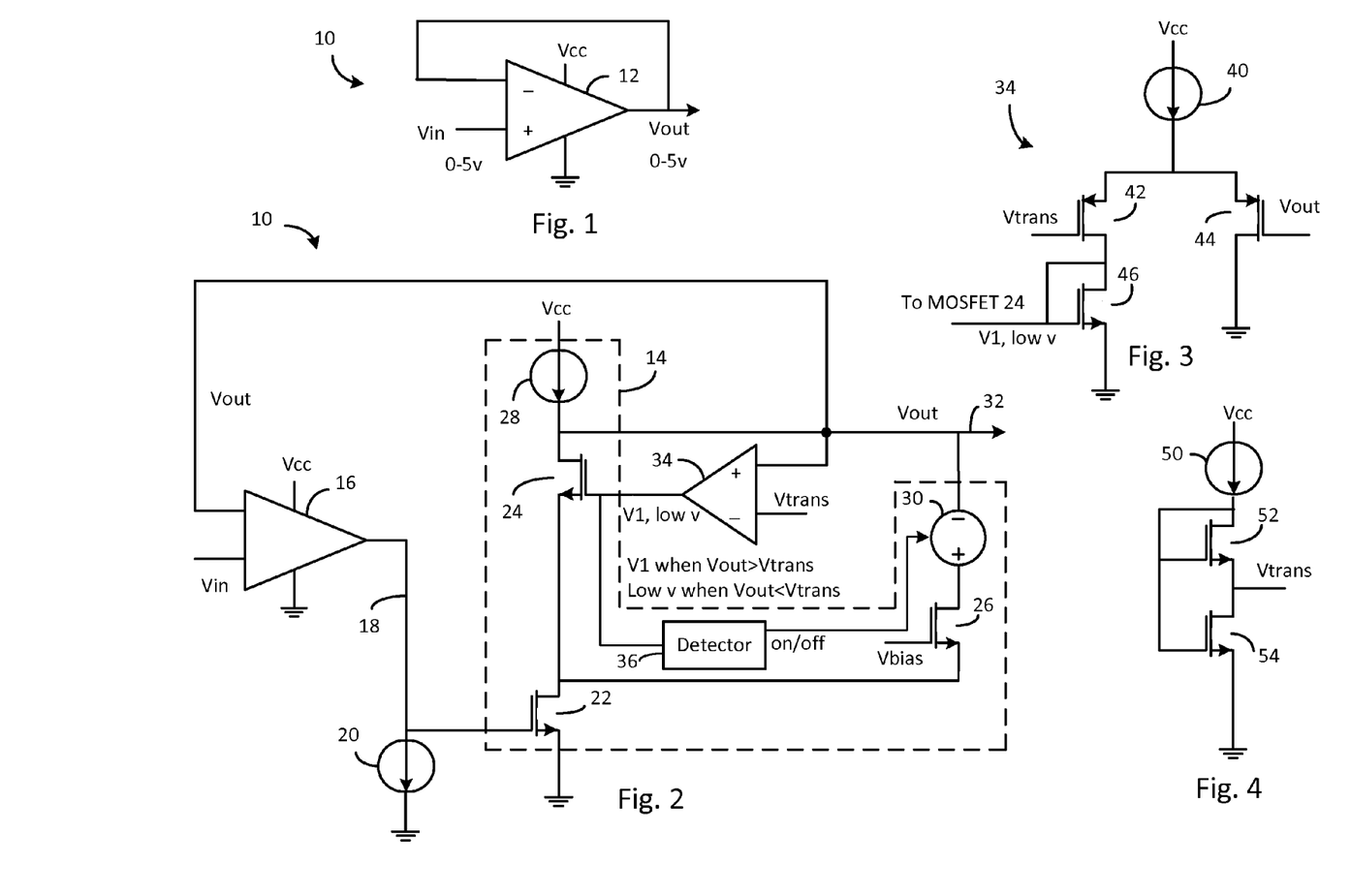
FIG. 1 represents the amplifier in accordance with one embodiment of the present invention, having an output that swings substantially between the positive supply voltage (or above) and ground (or below) using a single power supply in the output stage.
FIG. 2 illustrates a more detailed embodiment of the invention, showing an input stage, an output stage (comprising the MOSFETs that conduct current between the Vout terminal and ground), and a controller that turns off a main MOSFET and turns on an auxiliary MOSFET when Vout goes below a threshold (Vtrans) near ground.
FIG. 3 illustrates one possible circuit that may form the controller in FIG. 2.
FIG. 4 illustrates one possible circuit for generating a low threshold voltage Vtrans.

FIG. 1 illustrates an ideal, single-power supply amplifier 10, which the inventive circuit approximates. The output voltage Vout is fed back into an inverting input of an operational amplifier 12. The feedback forces Vout to equal the input voltage Vin over the full range of Vcc to ground.

FIG. 2 is a functional block diagram of the amplifier 10, which generates a Vout substantially from Vcc to ground (and below) using only a single power supply (generating Vcc) powering the output stage 14. This assumes an ideal controlled pull-up current source.

An input stage is depicted as a differential amplifier 16 that receives Vin at an input terminal and receives Vout, as a feedback voltage, at another input terminal to provide negative feedback. The proper polarities of the input terminals and output terminal of the differential amplifier 16 depend on the number of stages in the amplifier 10. In the example of FIG. 2, when Vin goes down, the output 18 of the differential amplifier 16 goes up. The amplifier 10 configuration of FIG. 2 causes Vout to substantially match Vin. If a gain greater than unity is desired, the feedback voltage may be a divided Vout voltage from a resistor divider.

The output 18 of the amplifier 16 is coupled to a current source 20. The output 18 is also coupled to the gate of an n-channel MOSFET 22. Accordingly, if Vin goes down, the gate voltage of MOSFET 22 increases to turn on MOSFET 22 more. The source of MOSFET 22 is connected to ground, and its drain is coupled to the sources of a main MOSFET 24 and an auxiliary MOSFET 26. A fixed bias voltage Vbias is coupled to the gate of MOSFET 26 so that its conduction (determined by Vgs) is controlled by its source voltage. Vbias is set so that MOSFET 26 begins to turn on when Vout is approximately Vtrans. Vtrans may be set slightly higher than $V_{DSAT}$ of MOSFET 24+$V_{DSAT}$ of MOSFET 22. A controllable current source 28 (e.g., a PMOS transistor) is coupled between Vcc and the drain of MOSFET 24. A charge pump voltage source 30 is coupled between the Vout terminal 32 and the drain of MOSFET 26. Vout is determined by the feedback.

In another embodiment, the bias voltage is not fixed but is load dependent.

A controller 34 is depicted as a differential amplifier and has a fixed threshold voltage Vtrans applied to its inverting input and Vout coupled to its non-inverting input. Vtrans is set to a relatively low level above ground, such as between 50 mV to 400 mV. Vtrans is typically set at the point where the MOSFET 24 begins to go into its triode mode when Vout is at Vtrans. The output of the controller 34 is a voltage V1, sufficient to turn on MOSFET 24, when Vout is greater than Vtrans, and at a low output voltage, sufficient to turn off MOSFET 24, when Vout is less than Vtrans. The output of controller 34 ramps down from the maximum V1 to the low voltage as Vout crosses Vtrans to avoid harsh output transients. When V1 is high, the MOSFET 24 operates as a conventional cascode transistor.

To generate a Vout equal to Vcc (because Vin equals Vcc), assuming an ideal controlled current source 28 with no voltage drop, MOSFET 22 is controlled by the amplifier 16 to decrease its conduction, so that the Vgs of MOSFET 24 is decreased and Vout is pulled up to approximately Vcc by the current source 28. When Vout falls below Vtrans (assuming Vin is below Vtrans), MOSFET 22 conducts and the output of controller 34 transitions low, substantially turning off MOSFET 24, so MOSFET 24 cannot operate in a reverse mode when Vout is pulled below the source of MOSFET 24 by MOSFET 26.

The fixed bias voltage Vbias applied to the gate of the auxiliary MOSFET 26 is set so that, when Vin is low enough to sufficiently turn on MOSFET 22 to cause Vout to fall below Vtrans, MOSFET 26 turns on (due to the Vgs of MOSFET 26 increasing above its turn on voltage). Thus, the auxiliary MOSFET 26 takes over the pulling down of Vout from the main MOSFET 24 when Vin falls below Vtrans. Vbias is set low enough so that when Vout is above Vtrans, MOSFET 26 is not conducting, allowing MOSFET 24 to control Vout. Vbias can be a fixed voltage or load dependent.

To prevent the Vds of MOSFET 26 from becoming too small and causing MOSFET 26 to enter a triode mode, a charge pump voltage source 30 is coupled between the drain of MOSFET 26 and the Vout terminal 32 to increase the drain voltage. In one embodiment, the voltage source generates 1.8 volts so that the drain cannot fall below 1.8 volts when Vout is at ground. Other voltage levels are suitable. Therefore, MOSFET 26 is in its saturation region when pulling Vout below Vtrans and down to ground or lower (assuming Vin goes to ground or lower). Voltage sources other than charge pumps are suitable.

To prevent the voltage source 30 from drawing power when Vout is above Vtrans, a detector 36 (e.g., a comparator) may be used to detect when the output of the controller 34 transitions low. As the output of the controller 34 transitions low, the detector 36 turns on the voltage source 30, such as by turning on a charge pump switching circuit. When the output of the controller 34 is high (a maximum V1 where only MOSFET 24 is conducting), the detector 34 turns off the charging circuit for the voltage source 30. Virtually no current is supplied by the voltage source 30 when the MOSFET 26 is off, so the voltage source 30 may maintain its stored voltage during the time that the MOSFET 26 is off without the charge pump switching. MOSFET 26 will operate in its saturation mode for a range of voltages generated by the voltage source 30, so the output generated by the voltage source 30 need not be precise. In another embodiment, the detector 36 is configured to turn on the voltage source 30 when Vout is slightly above Vtrans so that the voltage source 30 is fully charged to its final voltage when Vout falls to or below Vtrans. The auxiliary MOSFET 26 may conduct somewhat when Vout is at or slightly above Vtrans. In another embodiment, the detector 36 is triggered by different circuitry, such as by a separate comparator.

In operation, when Vout is above Vtrans, Vout is controlled by the variable conduction of MOSFETs 22 and 24. When Vout is below Vtrans, Vout is controlled by the variable conduction of MOSFETs 22 and 26 (both heavily conducting). When Vout crosses Vtrans, there is a smooth transition between the maximum V1 and the low output of the controller 34 so, during the transition, both MOSFETs 24 and 26 are conducting to different extents. In this way, there are no harsh transients generated at the output. In one embodiment, the output of the controller 34 swings between the maximum V1 and its lowest output over a 200 mV Vout range.

Accordingly, a majority of current from the Vout terminal is conducted by the main MOSFET 24 when Vout is above Vtrans, and a majority of the current from the Vout terminal is conducted by the auxiliary MOSFET 26 when Vout is below Vtrans, wherein the MOSFET 26 operates in its active region during a time when Vout falls below Vtrans, and the MOSFET 24 operates outside of its active region during a time when Vout falls below Vtrans.

FIG. 3 illustrates a circuit that may serve as the controller 34. A current source 40 is connected between Vcc and the sources of p-channel MOSFETs 42 and 44. The drain of MOSFET 44 is coupled to ground. If Vout is greater than Vtrans, MOSFET 42 conducts all current, via MOSFET 46, to ground. The drain of MOSFET 46 is connected to its gate to generate a corresponding gate voltage (V1) for MOSFET 24 (FIG. 2) when MOSFET 24 operates in its saturation region. As Vout becomes lower than Vtrans, MOSFET 44 conducts all current, and the gate voltage to MOSFET 24 approaches zero, turning MOSFET 24 off.

The circuit of FIG. 4 may be used to generate Vtrans. In FIG. 4, a current source 50 is connected between the drain of n-channel MOSFET 52 and Vcc. MOSFET 52 is coupled to ground via MOSFET 54, and the gates of MOSFETs 52 and 54 are coupled to the drain of MOSFET 52. This configuration generates a level of Vtrans at the source of MOSFET 52 determined by the relative sizes of MOSFETs 52 and 54 (since each conducts the same current generated by current source 50), allowing Vtrans to be only slightly above ground.

Figure 5:
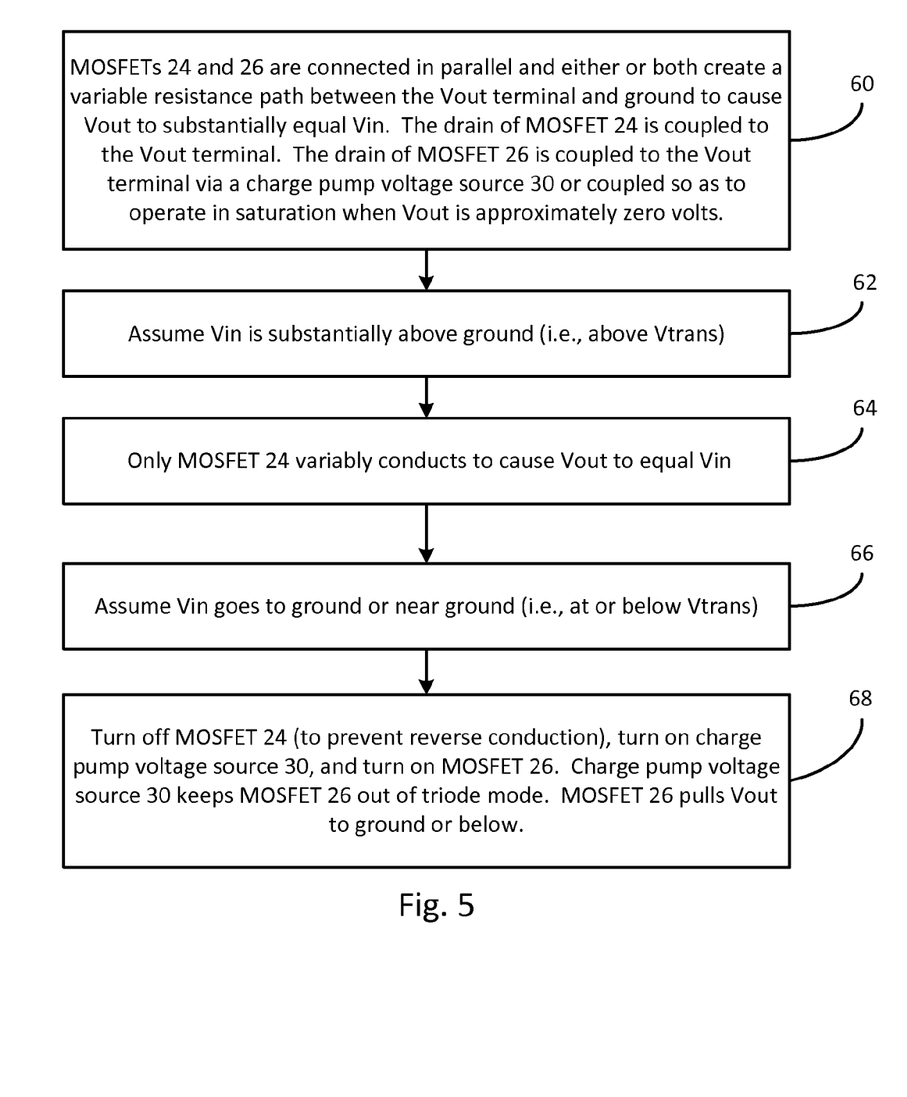
FIG. 5 is a flowchart identifying certain steps performed by the circuit of FIG. 2.

FIG. 5 is a flowchart identifying certain steps during the operation of the amplifier 10 of FIG. 2. In step 60, the basic configuration of the MOSFETs 24 and 26 is set out. The Vout terminal is pulled up by the current source 28, and the MOSFETs 24 and 26 are controlled to pull Vout down to match Vin. A voltage source 30 couples MOSFET 26 to the Vout terminal to add 1.8 volts (or any other suitable voltage) to its drain terminal to keep it out of the triode mode. Although it is preferred that the MOSFET 26 not operate in its triode mode, to minimize distortion, the MOSFET 26 may still operate in its triode mode while pulling Vout to ground or below.

Instead of using the voltage source 30 to ensure the Vds of the MOSFET 26 is sufficiently high to allow the MOSFET 26 to operate in saturation when Vout approaches zero volts, other techniques may be used.

In steps 62 and 64, it is assumed that Vin is substantially above ground (above Vtrans), where the amplifier 10 matches Vout to Vin without the use of MOSFET 26. Only MOSFET 24 variably conducts, in response to the conduction of MOSFET 22, to cause Vout to match Vin.

In step 66, it is assumed that Vin is now at ground or near ground (below Vtrans), which would normally cause MOSFET 24 to be in the triode mode.

In step 68, the MOSFET 24 enters its triode mode and its Vgs increases. This pulls down the source of the MOSFET 26 to cause it to begin conducting. Due to Vout going below Vtrans, the controller 34 transitions MOSFET 24 off, to prevent reverse conduction. The conduction of MOSFET 26 is controlled to match Vout to Vin. The voltage source 30 keeps MOSFET 26 out of the triode mode. There is a smooth hand-off between MOSFETs 24 and 26 to avoid harsh output transients. A detector 36 turns the voltage source 30 on only when Vout approaches Vtrans, in order to improve efficiency. In an alternate embodiment, the voltage source 30 is not used.

Figure 6:
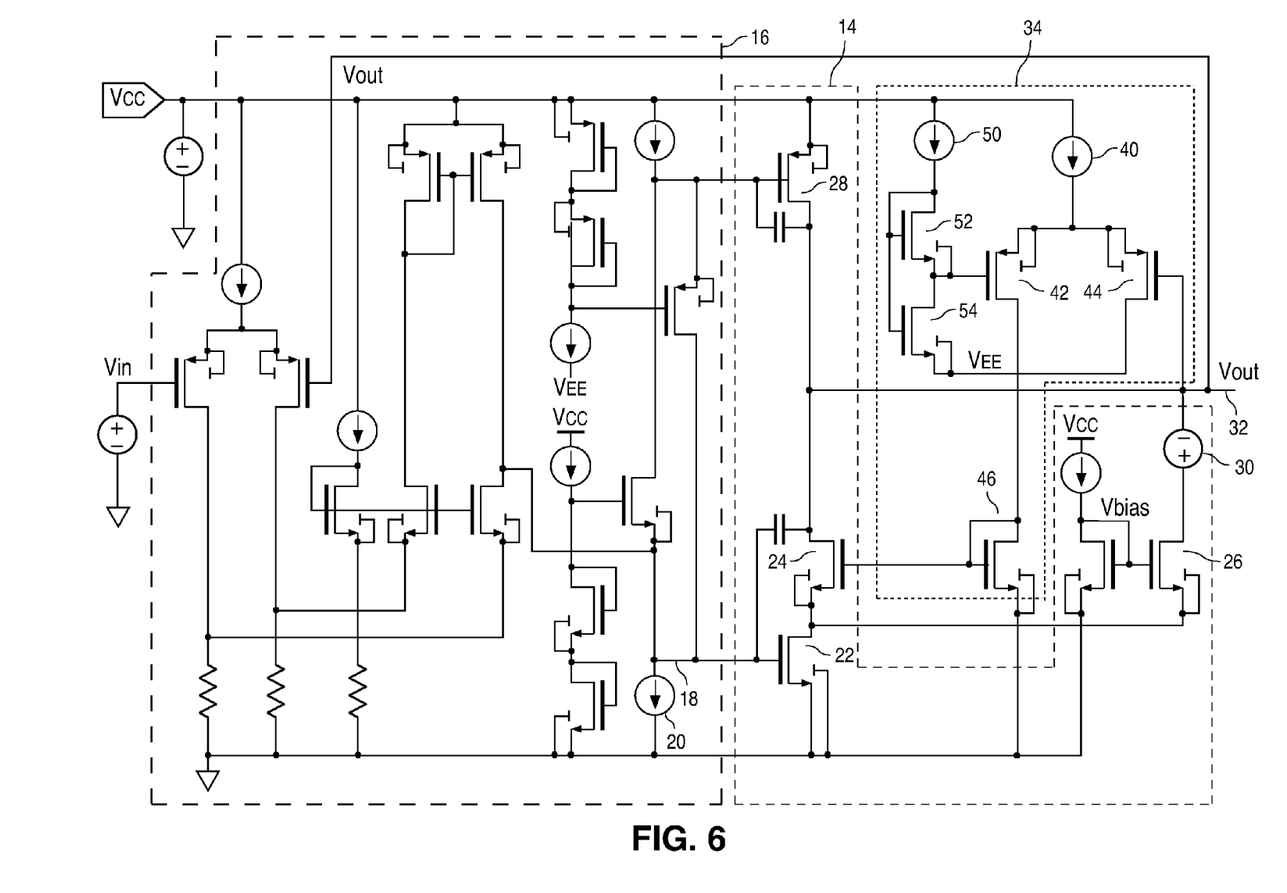
FIG. 6 is a detailed circuit schematic used to simulate an actual circuit corresponding to FIG. 2.

FIG. 6 is a detailed schematic diagram of one embodiment of the amplifier 10, with the various functional blocks labeled with the same numerals as in FIGS. 2-4. Those skilled in the art will understand the various circuit techniques used in FIG. 6 to perform the functions described above. The circuit of FIG. 6 is shown divided up into the input stage differential amplifier 16, the output stage 14, and the controller 34.

The input stage may be a multi-stage differential amplifier.

The amplifier 10, using a single power supply, may be used in any application. Although the example uses the amplifier to generate a Vout that tracks Vin, the amplifier 10 may instead be used as a comparator that switches between Vcc and ground when Vin crosses a trigger voltage.

In an actual amplifier 10, the pull up current source 28 will not be ideal and will have some voltage drop across it. Therefore, Vout cannot be pulled up to Vcc. If it is desired to enable Vout to fully swing between Vcc (or above) and ground (or below), a mirror image of the main MOSFET 24, auxiliary MOSFET 26, and charge pump voltage source 30 may be employed in the pull-up circuit to pull up Vout to Vcc, or even above Vcc. In such a case, the Vtrans for the pull up circuit will be slightly below Vcc. The conductivity types of the MOSFETs in the pull up circuit (e.g., PMOS) would be opposite to those used in the pull down circuit (e.g., NMOS) of FIGS. 2-4 and 6.

Figure 7:
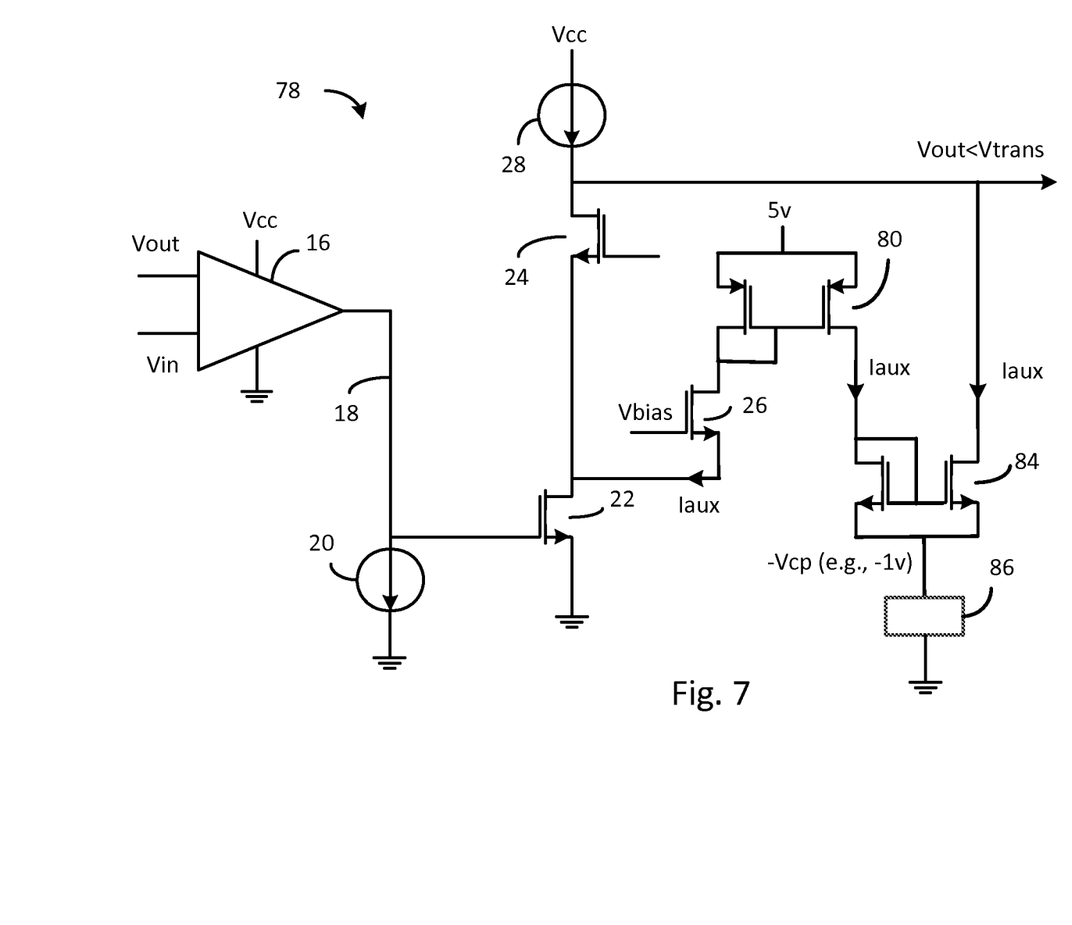
FIG. 7 illustrates an alternative circuit that provides headroom for the auxiliary MOSFET when Vout goes below Vtrans.

Instead of employing the voltage source 30 between the MOSFET 26 and the Vout terminal to provide a sufficiently large Vds (headroom) for the MOSFET 26 when Vout goes below Vtrans, various other techniques may be used to ensure a sufficiently large Vds. FIG. 7 illustrates such an alternative circuit.

FIG. 7 illustrates a portion of an alternative amplifier 78, where the portion is that related to creating sufficient headroom for the auxiliary MOSFET 26. All other portions of the amplifier 78 may be similar to FIG. 2. The drain of the MOSFET 26 is coupled to a high side current mirror 80. It is assumed the MOSFET 26 is being controlled to conduct a current Iaux and Vout is less than Vtrans. The current mirror 80 supplies the mirrored current Iaux to a low side current mirror 84. The low side current mirror 84 is connected to a negative voltage charge pump 86. The charge pump 86 may generate −1V, for example. The charge pump 86 may be turned on by the detector 36 in FIG. 2 when Vout goes below a threshold voltage. The current mirror 84 conducts the mirrored current of Iaux from the Vout terminal to control Vout to equal Vin. The charge pump 86 allows the current mirror 84 to operate properly even when Vout is at ground or below ground. The high side current mirror 80 provides sufficient headroom for MOSFET 26 for it to operate in saturation. The relative sizes of the current mirror transistors may be set to conduct any proportion of the MOSFET 26 current.

In another embodiment, the controller 34 (FIG. 2) is eliminated and a fixed gate voltage of an appropriate value is applied to the gate of the main MOSFET 24. When MOSFET 24 begins to operate in its triode mode due to Vout going below Vtrans, its source lowers. The lowering of the source lowers the source of the MOSFET 26 to cause the MOSFET 26 to conduct more of the current. A diode, or other technique, may be used to prevent the MOSFET 24 from conducting reverse current. The level of Vbias for the MOSFET 26 is selected to cause the MOSFET 26 to provide enough headroom to ensure MOSFET 22 does not enter triode when MOSFET 24 transitions into its triode mode. Accordingly, the transition from MOSFET 24 to MOSFET 26 conducting the majority of the Vout terminal current automatically occurs when the MOSFET 24 enters its triode mode, so no special controller is needed for detecting that Vout has gone below Vtrans.

Bipolar transistors may be used instead of MOSFETs but may require additional circuitry to allow for saturation effects. If a bipolar transistor replaced the main MOSFET 24, it would operate in its active mode when Vout is high and operate in its saturation mode when Vout is low. Similarly, if a bipolar transistor replaced the auxiliary MOSFET 26, it would operate in its active region when Vout is low and be off when Vout is high.

The amplifier may provide a single-ended output or a differential output.

While particular embodiments of the present invention have been shown and described, it will be obvious to those skilled in the art that changes and modifications may be made without departing from this invention in its broader aspects. The appended claims are to encompass within their scope all such changes and modifications as fall within the true spirit and scope of this invention.

What is claimed is:

1. An amplifier circuit comprising:
a voltage input terminal for receiving an input voltage Vin;
a voltage output terminal for outputting an output voltage Vout, the output terminal being coupled to a pull up circuit and a pull down circuit; and
a differential input stage connected to receive Vin and a first feedback voltage corresponding to Vout, the differential input stage generating a first signal,
the pull down circuit comprising:
  a first transistor connected to be controlled by the first signal to pull down the voltage output terminal to generate the first feedback voltage to substantially match Vin when Vout is above a transition voltage Vtrans; and
  a second transistor, connected in parallel with the first transistor, and connected to be controlled by the first signal to pull down the voltage output terminal to generate the first feedback voltage to substantially match Vin when Vout is below Vtrans,
wherein a majority of current from the Vout terminal is conducted by the first transistor when Vout is above Vtrans, and a majority of the current from the Vout terminal is conducted by the second transistor when Vout is below Vtrans, and
wherein the second transistor operates in its active region during a time when Vout falls below Vtrans, while the first transistor operates outside of its active region during a time when Vout falls below Vtrans.

2. The circuit of claim 1 further comprising:
a voltage source coupled to the second transistor to keep the second transistor operating in its active region when Vout goes below Vtrans; and
a control circuit coupled to a control terminal of the first transistor to turn the first transistor substantially off when Vout is below Vtrans such that only the second transistor pulls down the voltage output terminal when Vout is below Vtrans.

3. The circuit of claim 2 wherein the voltage source prevents the second transistor from operating in a triode mode when Vout falls below Vtrans.

4. The circuit of claim 2 further comprising a detector for turning off the voltage source during a time when Vout is above Vtrans by a certain amount.

5. The circuit of claim 1 wherein the control circuit outputs a first voltage to the control terminal of the first transistor to turn on the first transistor when Vout is above Vtrans and outputs a second voltage to the control terminal of the first transistor to substantially turn off the first transistor when Vout is below Vtrans, the circuit further comprising:
a third transistor coupled between a first terminal of the first transistor and ground, the third transistor having a control terminal coupled to receive the first signal to control the conductivity of the third transistor,
the third transistor controlling a voltage at the first terminal of the first transistor to control a conductivity of the first transistor to adjust Vout to generate the first feedback voltage to substantially match Vin when Vout is above Vtrans.

6. The circuit of claim 5 wherein a control terminal of the second transistor is connected to a bias voltage, wherein the third transistor is coupled between a second terminal of the second transistor and ground, the third transistor controlling a voltage at the second terminal of the second transistor to control a conductivity of the second transistor to adjust Vout to generate the first feedback voltage to substantially match Vin when Vout is below Vtrans.

7. The circuit of claim 5 wherein the first transistor, the second transistor, and the third transistor are all MOSFETs.

8. The circuit of claim 7 wherein the first transistor, the second transistor, and the third transistor are all NMOS transistors, wherein the control circuit comprises:
a current source having a first current source terminal coupled to a power supply voltage;
a first PMOS transistor having its source coupled to a second current source terminal and its gate coupled to receive Vtrans;
a first NMOS transistor having its drain coupled to a drain of the first PMOS transistor and its source coupled to ground, the drain of the first NMOS transistor being coupled to the gate of the first NMOS transistor and providing an output of the control circuit; and
a second PMOS transistor having its source coupled to the second current source terminal, its drain coupled to ground, and its gate coupled to the output voltage terminal for receiving Vout.

9. The circuit of claim 1 further comprising a controlled pull up current device coupled to the voltage output terminal.

10. The circuit of claim 1 wherein Vtrans is less than 400 mV.

11. The circuit of claim 1 further comprising a headroom generator, coupled between the second transistor and the voltage output terminal, to supply a load current to the voltage output terminal when Vout is below Vtrans and cause the second transistor to operate in its active region when Vout is below Vtrans.

12. The circuit of claim 1 wherein Vout is controlled by the amplifier circuit to be proportional to Vin.

13. The circuit of claim 1 further comprising:
a high side current mirror coupled to the second transistor to conduct a mirrored first current proportional to a current conducted by the second transistor;
a low side current mirror coupled to the high side current mirror to conduct a mirrored second current proportional to the current conducted by the second transistor, the low side current mirror being coupled to the voltage output terminal for conducting the second current from the voltage output terminal; and a negative voltage source coupled to the low side current mirror.

14. A method performed by an amplifier circuit comprising:
receiving an input voltage Vin at a voltage input terminal;
outputting an output voltage Vout at a voltage output terminal, the output terminal being coupled to a pull up circuit and a pull down circuit;
receiving Vin and a first feedback voltage corresponding to Vout by a differential input stage, the differential input stage generating a first signal;
controllably pulling down the voltage output terminal to control Vout by the method comprising:
controlling a first transistor by the first signal to pull down the voltage output terminal to generate the first feedback voltage to substantially match Vin when Vout is above a transition voltage Vtrans; and
controlling a second transistor, connected in parallel with the first transistor, by the first signal to pull down the voltage output terminal to generate the first feedback voltage to substantially match Vin when Vout is below Vtrans,
wherein a majority of current from the Vout terminal is conducted by the first transistor when Vout is above Vtrans, and a majority of the current from the Vout terminal is conducted by the second transistor when Vout is below Vtrans, and
wherein the second transistor operates in its active region during a time when Vout falls below Vtrans, while the first transistor operates outside of its active region during a time when Vout falls below Vtrans.

15. The method of claim 14 further comprising:
generating the transition voltage Vtrans;
generating a voltage by a voltage source coupled between the second transistor and the voltage output terminal; and
controlling the first transistor, by a control circuit, to turn the first transistor substantially off when Vout is below Vtrans such that only the second transistor pulls down the voltage output terminal when Vout is below Vtrans.

16. The method of claim 15 wherein the voltage source prevents the second transistor from operating in a triode mode when Vout falls below Vtrans.

17. The method of claim 15 further comprising turning off the voltage source during a time when Vout is greater than Vtrans by a certain amount.

18. The method of claim 14 further comprising:
applying a first voltage, generated by the control circuit, to a control terminal of the first transistor to turn on the first transistor when Vout is above Vtrans and applying a second voltage, generated by the control circuit, to the control terminal of the first transistor to substantially turn off the first transistor when Vout is below Vtrans; and
receiving the first signal at a control terminal of a third transistor, coupled between a first terminal of the first transistor and ground, to control a conductivity of the third transistor,
the third transistor controlling a voltage at the first terminal of the first transistor to control a conductivity of the first transistor to adjust Vout to generate the first feedback voltage to substantially match Vin when Vout is above Vtrans.

19. The method of claim 18 further comprising:
applying a bias voltage to a control terminal of the second transistor, wherein the third transistor is coupled between a second terminal of the second transistor and ground, the third transistor controlling a voltage at the second terminal of the second transistor to control a conductivity of the second transistor to adjust Vout to generate the first feedback voltage to substantially match Vin when Vout is below Vtrans.

20. The method of claim 18 wherein the first transistor, the second transistor, and the third transistor are all MOSFETs.

21. The method of claim 14 further comprising pulling up the voltage output terminal with a pull up current source.

22. The method of claim 14 wherein Vtrans is less than 400 mV.

23. The method of claim 14 wherein Vout is controlled by the circuit to be proportional to Vin.

24. The method of claim 14 further comprising:
conducting a mirrored first current, by a high side current mirror coupled to the second transistor, proportional to a current conducted by the second transistor;
conducting a mirrored second current, by a low side current mirror coupled to the high side current mirror, proportional to the current conducted by the second transistor, the low side current mirror being coupled to the voltage output terminal for conducting the second current from the voltage output terminal; and
supplying a negative voltage to the low side current mirror from a negative voltage source.

25. The method of claim 24 wherein the negative voltage source is a charge pump.

26. The method of claim 14 further comprising supplying a load current, by a headroom generator coupled between the second transistor and the voltage output terminal, to the voltage output terminal when Vout is below Vtrans and causing the second transistor to operate in its active region when Vout is below Vtrans.

27. A method performed by an amplifier circuit comprising:
receiving an input voltage Vin at a voltage input terminal;
outputting an output voltage Vout at a voltage output terminal, the output terminal being coupled to a pull up circuit and a pull down circuit;
receiving Vin and a first feedback voltage corresponding to Vout by a differential amplifier, the differential amplifier generating a first signal;
controllably pulling up the voltage output terminal to control Vout by the method comprising:
controlling a first transistor by the first signal to pull up the voltage output terminal to generate the first feedback voltage to substantially match Vin when Vout is below a transition voltage Vtrans; and
controlling a second transistor, connected in parallel with the first transistor, by the first signal to pull up the voltage output terminal to generate the first feedback voltage to substantially match Vin when Vout is above Vtrans,
wherein a majority of current from the Vout terminal is conducted by the first transistor when Vout is below Vtrans, and a majority of the current from the Vout terminal is conducted by the second transistor when Vout is above Vtrans, and
wherein the second transistor operates in its active region during a time when Vout rises above Vtrans, while the first transistor operates outside of its active region during a time when Vout rises above Vtrans.

28. The method of claim 27 further comprising supplying a load current, by a headroom generator coupled between the second transistor and the voltage output terminal, to the voltage output terminal when Vout is above Vtrans and causing the second transistor to operate in its active region when Vout is above Vtrans.

\* \* \* \* \*